United States Patent [19]

Arai et al.

[11] Patent Number: 4,504,323
[45] Date of Patent: Mar. 12, 1985

[54] METHOD FOR ANNEALING SEMICONDUCTORS WITH A PLANAR SOURCE COMPOSED OF FLASH DISCHARGE LAMPS

[75] Inventors: Tetsuji Arai, Kobe; Mitsuru Ikeuchi, Imabari, both of Japan

[73] Assignee: Ushio Denki Kabushiki Kaisha, Tokyo, Japan

[21] Appl. No.: 513,614

[22] Filed: Jul. 14, 1983

Related U.S. Application Data

[62] Division of Ser. No. 301,434, Sep. 11, 1981, abandoned.

[30] Foreign Application Priority Data

Sep. 12, 1980 [JP]  Japan ................ 55-126068

[51] Int. Cl.³ ............................... H01L 21/265
[52] U.S. Cl. .................... 148/1.5; 29/576 B; 29/576 T; 148/187; 357/91; 219/354
[58] Field of Search ............... 148/1.5, 187; 29/576 B, 29/576 T; 357/91; 219/354

[56] References Cited

U.S. PATENT DOCUMENTS

| | | | |
|---|---|---|---|
| 2,282,226 | 5/1942 | Hoop | 219/216 |
| 3,529,129 | 9/1970 | Rees | 219/216 |
| 3,883,296 | 5/1975 | Salvage et al. | 432/237 |
| 3,984,726 | 10/1976 | Ramler | 362/235 |
| 4,101,759 | 7/1978 | Anthony et al. | 219/343 |
| 4,276,479 | 6/1981 | Mibu et al. | 250/504 |

FOREIGN PATENT DOCUMENTS

| | | | |
|---|---|---|---|
| 55-68638 | 5/1980 | Japan | 219/354 |
| 2065973 | 7/1981 | United Kingdom | 29/576 B |

OTHER PUBLICATIONS

Cohen et al., Appl. Phys. Letts. 33 (1978), 751.
Powell et al., Appl. Phys. Letts. 39 (1981), 150.
Bomke et al., Appl. Phys. Letts. 33 (1978), 955.

Primary Examiner—Upendra Roy
Attorney, Agent, or Firm—Staas & Halsey

[57] ABSTRACT

A method for annealing semiconductors wherein a semiconductor wafer is placed on a table and a plurality of flash discharge lamps are disposed in a plane parallel and adjacent to the semiconductor wafer. A plane mirror is disposed in a plane parallel and adjacent to the plane of the flash discharge lamps on the side opposite from the table. The semiconductor wafer is exposed to irradiation by light from the flash discharge lamps, whereby the wafer is instantaneously annealed uniformly over the entire area thereof.

6 Claims, 2 Drawing Figures

METHOD FOR ANNEALING SEMICONDUCTORS WITH A PLANAR SOURCE COMPOSED OF FLASH DISCHARGE LAMPS

This is a division of application Ser. No. 301,434 filed Sept. 11, 1981 now abandoned.

BACKGROUND OF THE INVENTION

1. Field of the Invention

The present invention relates to equipment and a method for annealing semiconductors.

2. Description of the Prior Art

At present, the annealing technique is absorbing the attention of the semiconductor industry in two aspects. One is for the crystallization of a semiconductor element and the restoration of semiconductor crystals from damages which are caused, by the ion implantation of an impurity element; for example, phosphorus through the use of high energy into a silicon wafer with a view to providing the semiconductor element with a novel function. The most common traditional way of annealing is what is called the electric furnace method, in which the wafer is heated in an electric furnace 1 for example, at 1000° C. for 30 minutes while supplying thereinto dry nitrogen. This method is simple, but it has such drawbacks as follows:

(a) it causes warps in the wafer, thus decreasing the yield in the ensuing processes;

(b) as heating requires a prolonged time, the interior of the wafer is subject to changes in the implanted-ion distribution;

(c) the surface of the wafer is apt to be contaminated; and (d) a prolonged time is needed for annealing.

In view of these drawbacks, there is now being sought, as an alternative to this annealing method, the application of laser rays for brief exposure of the wafer thereto. Laser annealing, however, such as, in the case of using the pulse-oscillation laser, also has the following drawbacks:

(e) the distribution of the implanted ions is subject to substantial changes as their diffusion rate is extremely high in the liquid phase, though the restoration of semiconductor crystals from damages is effected because of the fusion of the wafer surface and the achievement of crystallization through the liquid epitaxial growth;

(f) because the radiated light is of a single wavelength, there occurs an interference pattern in the melting area, leading to uneven irradiation of the wafer;

(g) in the case of employing a continuous oscillation laser, the wafer is scanned by a small beam spot, resulting in producing a portion of insufficient annealing in the linear boundaries between scanning lines, and if the space between the scanning lines is reduced, then the scanning takes much time and often yields overheated portions, thus causing such a disadvantage as uneven irradiation; and (h) because of the laser light being of a single wavelength, an interference pattern is developed on the wafer surface to cause uneven irradiation thereof, and also as a common defect of the laser ray annealing, it calls for large and precise equipment and further advanced techniques for operation.

The other annealing is for producing, for example, a silicon wafer by the epitaxial growth of a silicon layer which is deposited on a suitable substrate by means of the ion evaporation technique. The annealing, in such a case, was hitherto performed in the same manner as above mentioned, that is, in an electric furnace, or by exposing the wafer to the laser ray, and in this case, there are the same defects as previously mentioned.

SUMMARY OF THE INVENTION

It is therefore an object of the present invention to provide novel equipment and method for annealing semiconductor wafers.

The annealing equipment of the present invention includes a table for mounting a semiconductor wafer, a plurality of flash discharge lamps disposed in planes parallel and adjacent to the semiconductor wafer placed on the table, and a plane mirror disposed in a plane parallel to the above-said planes and adjacent the lamp assembly on the opposite side from the table.

According to the annealing method of the present invention, the plurality of flash discharge lamps are disposed in each of two or more planes parallel and adjacent to the semiconductor wafer placed on the table and the plane mirror is disposed in a plane parallel to the two or more planes and adjacent the lamp assembly on the opposite side from the table. When annealing the semiconductor wafer by exposure to irradiation by light from the plurality of flash discharge lamps, at least one of the flash discharge lamps disposed in a specific plane is caused to flash after at least one of the flash discharge lamps disposed in the other plane.

DESCRIPTION OF THE PREFERRED EMBODIMENTS

Figure 1:
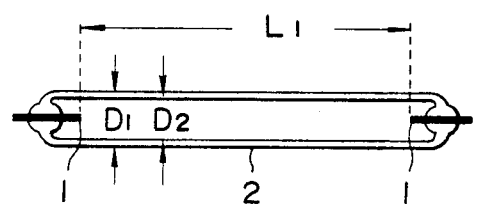
FIG. 1 is a schematic diagram showing an example of the flash discharge lamp for use in the present invention.

In FIG. 1 showing an example of the flash discharge lamp for use in the present invention, reference numeral 1 indicates a pair of electrodes; $L_1$ designates the arc length; and $D_1$ and $D_2$ identify the outer and the inner diameter of a bulb 2, respectively.

Figure 2:
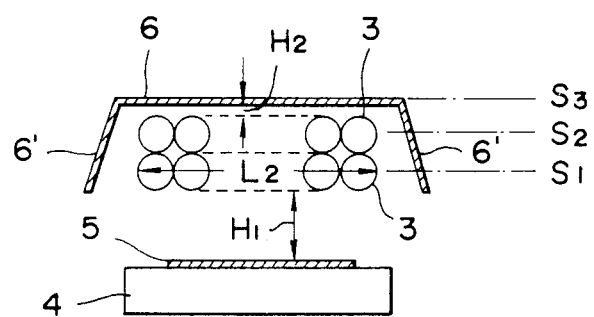
FIG. 2 is a schematic diagram illustrating an embodiment of the annealing equipment of the present invention.

In FIG. 2, the annealing equipment is shown in section as viewed from the longitudinal direction of flash discharge lamps 3. A semiconductor wafer 5 is placed on a table 4 and the flash discharge lamps 3 are respectively disposed in planes $S_1$ and $S_2$ parallel and adjacent to the semiconductor wafer 5. Further, a plane mirror 6 is disposed in a plane $S_3$ parallel to the planes $S_1$ and $S_2$ and adjacent to the plane $S_2$ on the side opposite from the table 4. Reference numeral 6' denotes light shielding or reflecting plates which are provided as required; $H_1$ represents the distance of irradiation $H_2$ represents the distance between the mirror 6 in plane $S_3$ and the lamps 3 in plane $S_2$; and $L_2$ shows the width of irradiation.

A specific example of numerical values of the equipment is as follows: Eight flash discharge lamps 3, each 10 mm in the outer diameter $D_1$, 8 mm in the inner diameter $D_2$ and 80 mm in the arc length $L_1$, are closely disposed in the plane $S_1$ at a distance of 10 mm ($H_1=10$ mm) from the semiconductor wafer 5 of a 2-inch diameter. Eight other flash discharge lamps 3 of the same size as mentioned above are arranged in the plane $S_2$ parallel to the plane $S_1$ so that they may be in close contact with the flash discharge lamps 3 in the plane $S_1$. The plane mirror 6 is disposed in the plane $S_3$ parallel to the plane $S_2$ and spaced about 2 mm ($H_2 = 2$ mm) apart from the flash discharge lamps 3 in the plane $S_2$. Accordingly, the semiconductor wafer 5 and the plane $S_1$ are spaced 15 mm apart; the planes $S_1$ and $S_2$ are spaced 10 mm apart; the planes $S_2$ and $S_3$ are spaced 7 mm apart; and the area of the plane of the light source by the flash discharge lamps 3 measures $80 \times 80$ mm.

From the viewpoint of efficient utilization of fluxes of light from the plane of the light source, it is preferred that the distance $H_1$ between the lamps 3 in plane $S_1$ and the semiconductor wafer 5, and the distance $H_2$ between the lamps 3 in plane $S_2$ and the plane mirror 6 be selected so that the intensity of illumination on the semiconductor wafer 5 may be about 70% or more of that in an ordinary plane source of light in terms of the intensity of illumination in the direction perpendicular from a center of the light source.

In the case of annealing a semiconductor wafer by the use of ordinary xenon lamps or flash discharge lamps, since the surface of the semiconductor wafer is mirror-finished, an appreciable quantity of incident light is reflected by the wafer surface, so that it is necessary to irradiate the wafer by a very large quantity of light. In the present invention, however, as the semiconductor wafer 5 and the plane mirror 6 are disposed in parallel and adjacent relation across the flash discharge lamps, light reflected by the semiconductor wafer 6 is reflected back thereto by the plane mirror 6 and a multiple reflection effect is produced by such repetitive reflections, thus enabling extremely efficient utilization of light from the flash discharge lamps.

With the above-said annealing equipment, a silicon wafer doped with phosphorus in an amount of $1 \times 10^{15}$ atoms/cm$^2$ by an energy of 50 KeV can sufficiently be annealed, after being preheated by an electric furnace up to 400° C., by exposure to irradiation by light from the flash discharge lamps which are each driven to deliver a radiant energy of 3000 joules for a pulse-width ($\frac{1}{2}$ peak value) period of 800 μsec. The preheating neither "warps" nor anneals the semiconductor wafer and it also does not cause rediffusion of the dopant. That is, the preheatment is auxiliary heating for annealing by the flash discharge lamps. The preheating up to temperatures below 400° C. serves as auxiliary heating for instantaneous heating and annealing of the semiconductor wafer by the flashlight irradiation without adversely affecting the semiconductor wafer.

Evaluation was made in terms of doping efficiency, as to whether the semiconductor wafer was annealed sufficiently or not. The doping efficiency is 100% in the case where simultaneous lighting of the eight flash discharge lamps 3 in the plane $S_2$ is delayed for about 800 μsec relative to simultaneous lighting of the eight flash discharge lamps 3 in the plane $S_1$. This delayed lighting will be described in brief. Even if the flash discharge lamps 3 in the plane $S_2$ are lighted during the lighting of the flash discharge lamps 3 in the plane $S_1$, the utilization ratio of light from the flash discharge lamps 3 in the plane $S_2$ changes due to the absorption of light by plasma occurring in the flash discharge lamps 3 in the plane $S_1$. For example, in the case of undelayed lighting or concurrent lighting of the flash discharge lamps in both planes $S_1$ and $S_2$, the doping efficiency is 85%. In the case of lighting the flash discharge lamps in only one of the planes $S_1$ and $S_2$, the doping efficiency is approximately 50%.

The relationship between the intensity of illumination and the doping efficiency varies with the concentration of the dopant used, too. In the case of such a concentration of $1 \times 10^{15}$ atoms/cm$^2$ as mentioned previously, an appreciably high intensity of light is required. To this end, it is necessary to arrange flash discharge lamps in two layers in the planes $S_1$ and $S_2$ and to minimize the influence of the light absorption by plasma so that a maximum intensity of light may be obtained. In the case of such a low dopant concentration on the order of $10^{14}$, however, a 60% or more doping efficiency may sometimes be obtained through the use of only a one-layer arrangement of flash discharge lamps.

The value of radiant energy of each flash discharge lamp, the number of flash discharge lamps to be used, the number of layers of the lamps to be arranged and the time lag in lighting the lamps may be determined in accordance with the kind and the quantity of dopant used and the energy for the implantation thereof.

In all cases, however, as the surface of the semiconductor wafer to be annealed is mirror-finished, it is of importance that the plane where the semiconductor wafer is placed, the plane or planes where the flash discharge lamps are arranged and the plane where the plane mirror is disposed are parallel and adjacent to one another so as to make full use of the multiple reflection effect by the semiconductor wafer and the plane mirror. The flash discharge lamps arranged in flat planes essentially constitute a plane source of flashlight of high intensity, by which the semiconductor wafer of a large area can be instantaneously annealed uniformly throughout it. Thus the present invention overcomes the drawbacks of the prior art.

It will be apparent that many modifications and variations may be effected without departing from the scope of the novel concepts of this invention.

What is claimed is:

1. Method of annealing a semiconductor comprising the steps of:
    disposing a plurality of flash discharge lamps in each of two or more planes parallel and adjacent to a semiconductor wafer;
    disposing a plane mirror in a plane parallel and adjacent to the two or more planes on the opposite side from the semiconductor wafer; and
    lighting at least one of the flash discharge lamps disposed in a specified one of the planes after lighting at least one of the flash discharge lamps in the other plane, thereby annealing the semiconductor wafer.

2. A semiconductor annealing method according to claim 1, wherein the semiconductor wafer is preheated up to a certain temperature and then annealed by concurrent or delayed lighting of the flash discharge lamps.

3. A method of annealing a semiconductor comprising the steps of:
    disposing a plurality of flash discharge lamps in each to two or more planes substantially parallel and adjacent to the semiconductor;
    disposing a planar mirror in a plane substantially parallel and adjacent to the two or more planes of flash discharge lamps;
    flashing the flash discharge lamps in one of the planes at a time which is staggered with respect to the flashing of the flash discharge lamps in the other planes.

4. A method according to claim 3, wherein the time of flashing the flash discharge lamps in each plane with respect to the time of flashing the flash discharge lamps in each of the other planes is staggered by approximately 800 μsec.

5. A method according to claim 3, wherein all of the flash discharge lamps in each plane are flashed at a time which is staggered with respect to the flashing of all of the flash discharge lamps in each of the other planes.

6. A method of annealing according to claim 3, further comprising the step of preheating the semiconductor to a certain temperature before flashing the flash discharge lamps.

* * * * *

UNITED STATES PATENT AND TRADEMARK OFFICE
CERTIFICATE OF CORRECTION

PATENT NO. : 4,504,323

DATED : March 12, 1985

INVENTOR(S) : Arai et al.

It is certified that error appears in the above-identified patent and that said Letters Patent is hereby corrected as shown below:

Col. 4, line 57, "to" should be --of--.

Signed and Sealed this

Sixth Day of August 1985

[SEAL]

Attest:

DONALD J. QUIGG

Attesting Officer     Acting Commissioner of Patents and Trademarks